United States Patent
Vile et al.

(10) Patent No.: US 8,102,285 B2
(45) Date of Patent: Jan. 24, 2012

(54) MODULAR DEBOUNCING DEVICE

(75) Inventors: Timothy C. Vile, Rutland, VT (US);
Dale A. Christie, Proctor, VT (US)

(73) Assignee: Kalow Technologies, Inc., North Clarendon, VT (US)

( * ) Notice: Subject to any disclaimer, the term of this patent is extended or adjusted under 35 U.S.C. 154(b) by 902 days.

(21) Appl. No.: 12/155,557

(22) Filed: Jun. 5, 2008

(65) Prior Publication Data

US 2009/0303088 A1    Dec. 10, 2009

(51) Int. Cl.
*H03M 11/00* (2006.01)

(52) U.S. Cl. ......................................... 341/24

(58) Field of Classification Search ...................... 341/24
See application file for complete search history.

(56) References Cited

U.S. PATENT DOCUMENTS

| | | |
|---|---|---|
| 4,736,097 A | 4/1988 | Philipp |
| 4,829,445 A * | 5/1989 | Burney ......................... 700/230 |
| 4,851,738 A | 7/1989 | Yang |
| 5,012,239 A | 4/1991 | Griebeler |
| 5,295,071 A * | 3/1994 | Kuzma et al. ..................... 702/4 |
| 5,305,210 A * | 4/1994 | Kuzma et al. ..................... 702/4 |
| 5,349,380 A | 9/1994 | Stein |
| 6,115,438 A | 9/2000 | Andresen |
| 6,140,620 A * | 10/2000 | Aldridge et al. ............... 219/493 |
| 6,377,094 B1 * | 4/2002 | Carley .......................... 327/164 |
| 6,865,408 B1 * | 3/2005 | Abbink et al. ................ 600/310 |
| 6,957,174 B2 | 10/2005 | Wall |
| 7,092,850 B2 | 8/2006 | Wall |
| 7,369,969 B2 | 5/2008 | Scherr |
| 2007/0271056 A1 | 11/2007 | Nussbaumer et al. |

OTHER PUBLICATIONS

Horowitz and Hill, The Art of Electronics (1980), p. 342.
Horowitz and Hill, The Art of Electronics, $2^{nd}$ ed. (1989), pp. 506-507, 789.

* cited by examiner

*Primary Examiner* — Stephen W Jackson

(74) *Attorney, Agent, or Firm* — Michael de Angeli

(57) ABSTRACT

A modular debouncing device is adapted to be connected between an input device, such as a switch or sensor element, and a controlled element and analyzes an input signal from the input device according to a stored debouncing algorithm in order to determine whether a change of state of the input signal should be responded to by controlling an output control signal to change its state.

16 Claims, 2 Drawing Sheets

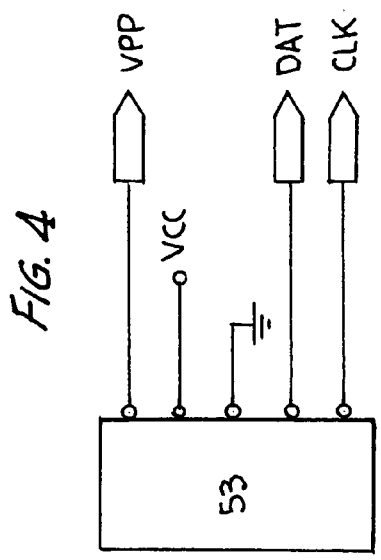
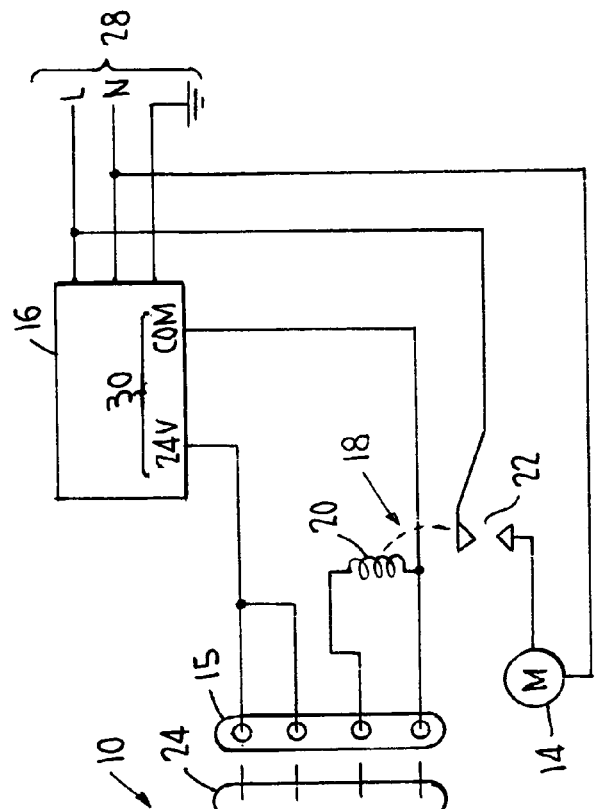
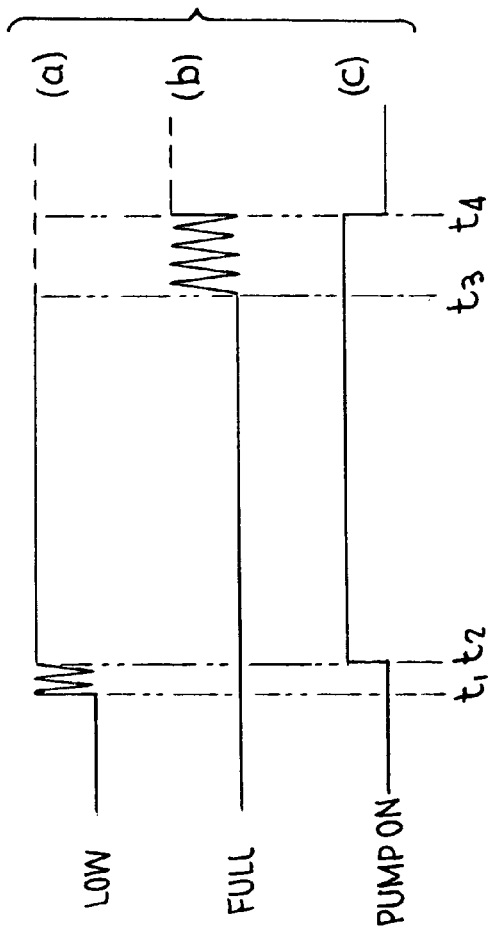
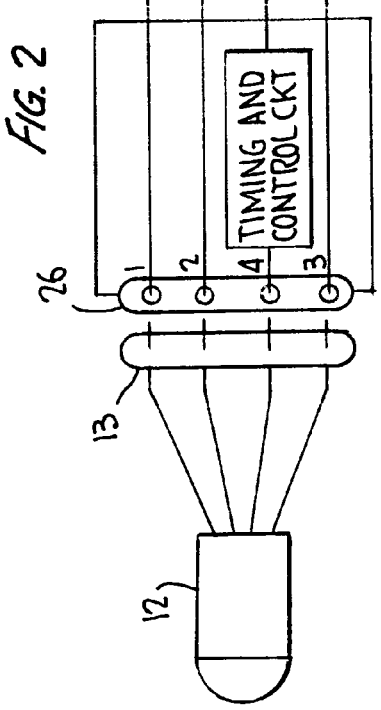

MODULAR DEBOUNCING DEVICE

FIELD OF THE INVENTION

This invention relates to a modular device comprising a debouncing circuit that can conveniently be interposed between an inut device, such as a switch or a sensor, and a controlled device to "debounce" the control signal, that is, to prevent transient and spurious effects from interfering with proper control.

BACKGROUND OF THE INVENTION

It is generally known to provide "debouncing" in various sorts of control circuits to prevent spurious or undesired control outputs. For example, a mechanical switch typically will comprise a moving element that is brought into contact with a stationary element, closing a control circuit. If the moving element physically bounces, due to resilience of the components or like causes, the control circuit may be closed and opened several times in quick succession, leading to application and withdrawal of power to a controlled device in rapid sequence, which can be very undesirable. It is known to provide "debounce" circuitry to preclude this effect; this may be as simple as providing a delay after the first change of state of the switch before any control action is taken.

In another common circumstance, a sensor may be arranged to determine a physical constant, for example the level of liquid in a tank, and control a device in response thereto, for example, to cause a pump to be energized to fill the tank. If there are waves in the liquid level, the sensor may give repeated signals that the level is first above, then below the desired level, leading to the pump's cycling on and off, which can be very damaging and might lead to an overfilling condition. Here again it is known to provide debounce circuitry, in this case perhaps most simply implemented by avoiding any control action until after a series of identical successive sensor outputs have been detected, indicating that the change of state has persisted for beyond a minimum time.

A related problem is that of avoiding "hunting" of a controlled variable around a desired value. For example, suppose a thermostat is set to keep a house at 68 degrees F., such that the furnace is controlled to be started when the temperature is below 68 degrees and stopped when it is above 68 degrees, thus providing a "control loop". It is apparent that the furnace might well continuously cycle on and off, thus "hunting" around the 68 degree "setpoint". This is commonly avoided by spacing the control points some distance apart, e.g., so that the furnace goes on when the temperature drops to 67 degrees and is shut off when it reaches 69 degrees. Another possibility is to avoiding changing the control state—that is, turning the furnace on or off—until the temperature has been on one side or the other of the desired value for more than a predetermined time. These solutions to the "hunting" and related problems are sometimes referred to as providing "hysteresis" to the control loop, in that the proper action to be taken in response to a particular state of the sensed value depends on the recent history of the circuit.

The art is aware of numerous additional circumstances wherein debouncing of signals is useful, including provision of hysteresis as above, and these additional circumstances are intended generally to be considered within the scope of the present invention.

As mentioned, the prior art shows various circuits and related techniques for providing debouncing in varied circumstances. One typical approach is shown in Wall U.S. Pat. Nos. 6,957,174 and 7,092,850, which teaches preventing the change of state of the controlled device until the sensed signal has been stable for more than a predetermined time. Yang U.S. Pat. No. 4,851,738 shows a similar technique in control of a lighting circuit. Also generally relevant are Philipp U.S. Pat. No. 4,736,097, showing prevention of spurious triggering in an optical detector circuit; Griebeler U.S. Pat. No. 5,012,239, showing debouncing in a position sensor circuit, to eliminate spurious pulses; Stein U.S. Pat. No. 5,349,380, showing a circuit for avoiding crosstalk between adjacent pixels in a video system; Andresen U.S. Pat. No. 6,115,438, showing debouncing in a phase-locked-loop circuit; Scherr U.S. Pat. No. 7,369,969, also showing prevention of a change of state until a sensed signal has been stable for at least a predetermined time; and Nussbaumer et al patent application 2007/027056, showing a similar technique used in a measuring circuit.

Horowitz and Hill, in "The Art of Electronics", also teach at p. 342 use of flip-flop circuits to debounce signals that would otherwise exhibit extra pulses resulting from bouncing of mechanical switch contacts.

Insofar as known to the present inventors, however, the prior art does not show a debounce circuit that can be conveniently interposed in a simple, low-cost control circuit. More specifically, in particular in the more recent of the prior art discussed above, the debounce functionality is typically provided by hardware integrated with software whereby a processor, e.g., a microprocessor or similar computer device, controls a device responsive to a sensed variable. Given the presence of the processor it is a simple matter to add the debounce functionality, e.g., as done in the Wall patents. In the other prior art discussed above, e.g., as in the Horowitz and Hill reference, the debounce feature is provided integrally with the control circuit. In a control circuit not implemented by a microprocessor, typically for reasons of cost, debouncing might well be desired but is not readily implemented. It is therefore an object of the invention to provide a simple, inexpensive modular debounce device that can readily be added to a simple control circuit to provide the debounce functionality.

SUMMARY OF THE INVENTION

The present invention provides a modular debounce device, that is, a debounce circuit implemented in a modular device capable of being readily interposed between, for example, a preexisting input device such as a switch or sensor and a controlled device, both conforming to given industry connection standards, and without requiring modification of either. The modular debounce device of the invention can be programmed at manufacture or later with various desired debounce algorithms, depending on the application. Additional features and advantages of the invention will be apparent from the detailed discussion below.

BRIEF DESCRIPTION OF THE DRAWINGS

The invention will be better understood if reference is made to the accompanying drawings, in which:

FIG. 1 illustrates typical signals encountered in control circuits, and a preferred debounced output signal, all as functions of time;

FIG. 2 is a schematic diagram illustrating a typical application for the modular debounce circuit of the invention;

FIG. 4 shows the connections provided by an in-circuit programming header used to set the operational parameters of the circuit of FIG. 3.

DESCRIPTION OF THE PREFERRED EMBODIMENTS

Figure 3:
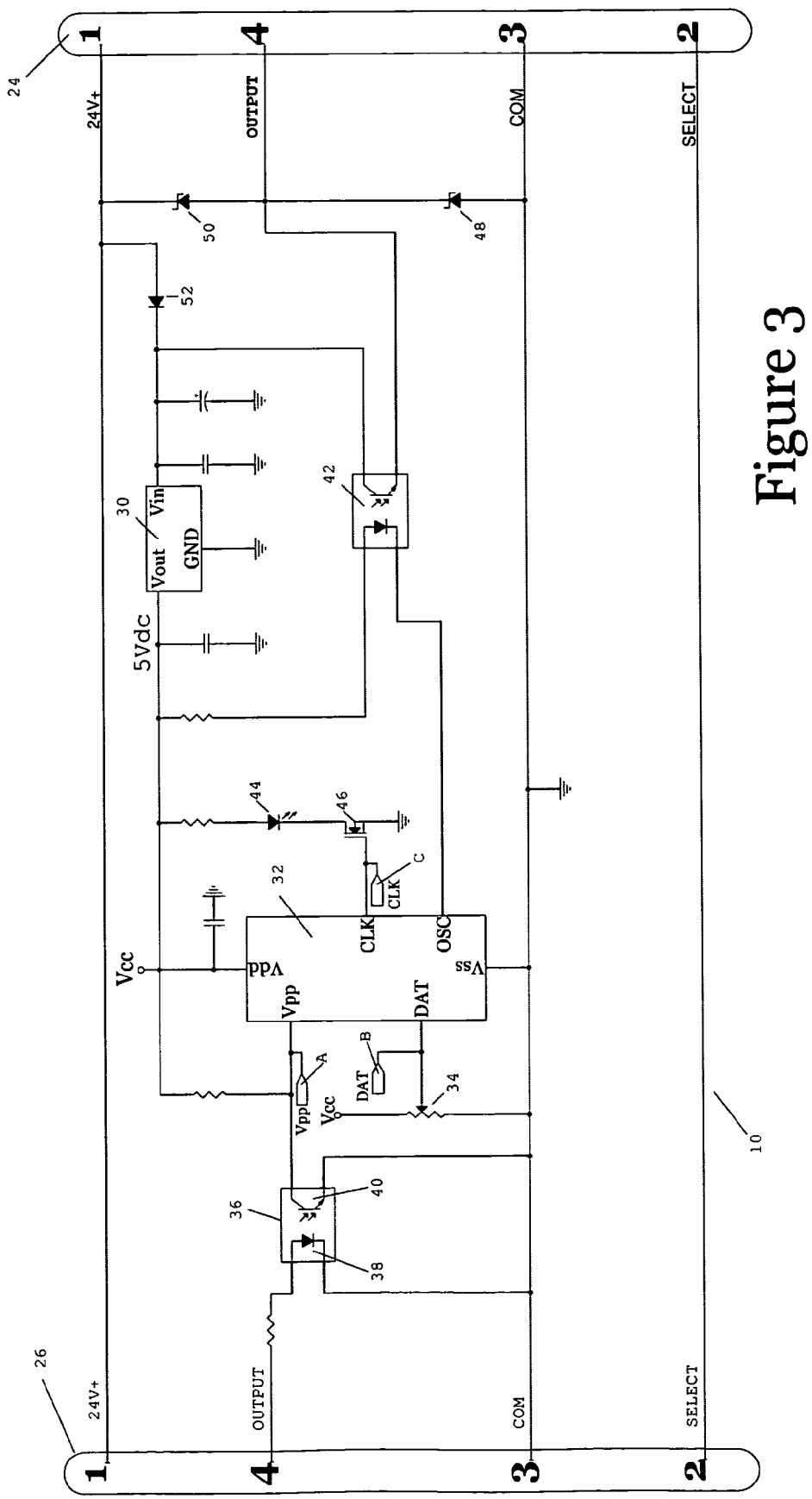
FIG. 3 is a detailed schematic diagram of one preferred embodiment of the modular debounce circuit of the invention.

FIG. 1 illustrates in FIGS. 1(a) and (b) the problem of "bouncy" signals and in FIG. 1(c) an example of a debounced control signal. In this example, it is assumed that the objective is to control the level of fluid in a tank. A first level sensor provides a signal, termed LOW, as illustrated in FIG. 1(a), that transitions from a low level to a higher level when the fluid in the tank falls to the point of activating the level sensor. A second level sensor provides a comparable FULL signal, which transitions from a low level to a higher level when the tank has been filled. In each case, mechanical switches operated by floating actuators are commonly arranged to close switch contacts in order to give the corresponding signals. (Of course, other sorts of input devices providing control signals to controlled devices, such as photosensors and the like, are within the scope of the invention.) The switch contacts may physically bounce due to mechanical factors, and the device that closes the switch may also exhibit instability, e.g., due to waves and turbulence in the tank due to pumping. In either case it is desired to debounce the control signal so that the controlled device—here typically a pump—does not cycle on and off during the filling process.

Thus, in FIG. 1(a), when the level of fluid in the tank falls at time $t_1$ to the point of actuating a low-level switch, the switch is nominally closed; however, as illustrated, the contacts may bounce physically from one another, leading to the unstable signal form shown. Accordingly, it is desired to "debounce" this signal by delaying giving a control signal to a pump motor until the signal has settled to the new state. As noted this can be determined in a variety of ways, e.g., delaying giving the change of state control signal until a given amount of time has passed, analyzing the input signal to ensure that its change of state is not merely transitory, and the like.

Likewise, at $t_3$, the signal from a sensor arranged to detect that the tank is full may initially be actuated by a wave in the tank caused by turbulence from pumping. It is likewise desirable to delay shutting off the pump until the sensor's output indicates that the tank is truly full, e.g. until waves are above the sensor level and no longer affect its output.

FIG. 1(c) shows the desired debounced pump control output signal; pump operation is delayed until $t_2$, when the LOW signal has stabilized, and continues until $t_4$, when the tank is full.

As above, debouncing of signals of this general type is well-known, as are various algorithms for accomplishing debouncing, but to the inventors' knowledge this has not previously been offered in a simple, low-cost device that can readily be added to an existing control circuit not including a microprocessor or like sophisticated device providing such capability.

It is a more specific object of the invention to provide a modular debounce device that can be interposed in a control circuit employing industry-standard connections to provide the debounce function without requiring modification of either the input device, again, a switch or any of a variety of sensors, or of the controlled device. FIG. 2 shows how the modular debounce device of the invention 10 can be thus interposed in a control circuit.

More particularly, in the example of FIG. 2, the modular debounce device of the invention 10 is interposed between a photodetector 12 and a motor 14, with associated power supply 16. A relay 18, comprising a coil 20 and associated contact set 22, controls application of current to motor 14. In the example, relay 18 is normally open, as illustrated. These components might be used, for example, to control the level of liquid in a tank; if the output of photodetector 12 indicates that the level has fallen below a desired level, motor 14 can be energized in order to operate a suitable pump (not shown). (It will be appreciated that if a second photodetector is employed to sense that the tank has been filled to a desired level, as in the FIG. 1 example, a second similar debouncing device will be required to debounce the output of the second detector.)

In this example, the photodetector 12 may be connected to the motor 14, relay 18, and power supply 16 through industry-standard "M12" connections, whereby a male plug having four defined connections is received by a corresponding female receptacle. Another common standard is referred to as "M8", and others will doubtless occur to those of skill in the art. As illustrated, the modular debounce circuit of the invention 10 is provided with a male plug 24 and a female receptacle 26 in order to be readily connected between the photodetector 12 on the one side and the motor 14, power supply 16, and relay 18 on the other.

Thus, as will be appreciated by those of skill in the art, in the absence of the modular debounce device 10 of the invention, the male plug 13 on the photodetector 12 could be connected directly to the female plug 15 to which are connected the motor 14, relay 18 and power supply 16. In that case, the power supply 16 receives normal 110 VAC power from input lines 28, and provides 24 VDC across output lines 30. These power supply connections are connected directly to the photodetector 12, as shown, via pins 1 and 3 on the connections 13 and 15. The output of photodetector 12 is provided at pin 4, such that when the photodetector 12 provides an output signal to relay coil 20, contacts 22 close, energizing motor 14 by connecting it to power lines 28. Pin 2 carries a Select signal that in the example can simply be tied to the +24 VDC power supply on pin 1. The Select signal is used in some circumstances to configure the sensor; the modular debounce device of the invention simply passes it through unchanged.

As discussed above, in many circumstances the output from photodetector 12 or another input device may change states rapidly, due to any of a large number of factors, including instability in the variable being monitored, e.g., waves in a tank being monitored or variation in reflectivity of a moving product, electrical noise due to switch contact bounce or outside interference, and others. Repetitive excitation of an inductive load such as a motor can be very damaging, and there are many other circumstances in which such frequent changes of state of the controlled device are undesirable.

As acknowledged above, where an overall process is being controlled by a microprocessor or the like it is well-known to debounce the control circuit in any of a variety of ways, e.g., as taught by the Wall patents. However, insofar as known to the present inventors, there has been no suggestion of a modular debounce device adapted for ready interposition into a simple, "non-intelligent" circuit such as in FIG. 2, thus providing the debounce function without the cost of an intelligent control device such as a microprocessor.

FIG. 3 shows one embodiment of a modular device 10 that can be interposed in a control circuit for providing debounce functionality without modification of its other components. As illustrated, the circuit is connected between a male plug 24 that is plugged into female receptacle 15 connected to the motor 14, relay 18 and power supply 16 of FIG. 1 on one side, and a female receptacle 26 on the other side, which receives the male plug 13 from the photodetector 12. (Note that the order of the pins in the connections is shown differently in FIG. 3 than in FIG. 2.) Thus the device of the invention 10 might be interposed in the existing control circuit of FIG. 2 simply by unplugging the photodetector from the motor, relay, and power supply and connecting the circuit 10 of the invention therebetween.

As discussed above, power supply 16 provides 24 VDC across pins 1 and 3, labeled 24V+ and COM. The 24 VDC input power is reduced by a voltage regulator 30 to 5 VDC, that is, Vcc, the operating power supplied to the components of the circuit. For example, Vcc is supplied to a programmable controller 32. This chip, which may be implemented by the Model PIC10F220 from Microchip, Inc., essentially examines the input signal from photodetector 12, provided at pin 4 of input connection 26, debounces it according to a desired algorithm, and provides an output signal on corresponding pin 4 of output connection 24.

The algorithm used by programmable controller 32 to debounce the input signal may vary substantially within the scope of the invention. For example, in many circumstances it will suffice to monitor the state of the input signal, e.g., whether it is ON or OFF, over time, and only change the state of the output signal when the input signal has changed and remained in its new state for more than a predetermined delay time T. T might vary considerably; a 10 ms delay T would typically be adequate, for example, to debounce a signal that was intermittent due to mechanical switch contact bounce, while a 5 second delay T might be appropriate to eliminate the effects of wave action in a tank.

Related options include providing a debounce delay upon change of state of the input signal from "ON" to "OFF", but not the reverse; to provide a debounce delay upon change of state of the input signal from "OFF" to "ON", but not the reverse; to provide the debounce delay upon any change of state; and to provide different delays depending on the direction of change of state.

Several options are provided in the circuit shown for adjustment of variables such as the delay time T. A potentiometer 34 may be connected at an input of controller 32 to do so; this could be arranged for setting T at manufacture or so as to allow user adjustment in the field.

Alternatively, T can be set at manufacture or later by connection of an in-circuit programming header 53 (FIG. 4) to the predetermined connection points, indicated on the circuit diagram of FIG. 3 at A, B, and C, and downloading appropriate software implementing the desired debounce algorithm. More specifically, typically the controller 32 will be permanently assembled at manufacture to a circuit board carrying it and the other circuit components. The in-circuit programming header 53 can then be plugged into a socket on the circuit board for connection to controller 32, such that the program carried out by the controller 32 can be altered after assembly. Thus, the header 53 provides a convenient way to alter the program run by controller 32, or to alter parameter values or other data stored thereby.

For example, in the manufacturing context a large number of the modular debounce devices of the invention could be manufactured identically in advance and then customized to the particular user's needs by subsequent programming by way of in-circuit programming header 53; that is, provision of connection to the programming header 53 allows ready connection of the controller 32 to a computer for receiving custom software downloaded by the manufacturer's engineers responsive to each user's special needs.

More specifically, as illustrated, connection point A allows a signal Vpp to be provided to controller 32; this signal indicates to the controller that a download of some type is to be entered. The additional connections DAT and CLK, provided at connection points B and C respectively, comprise the actual data and a clock signal for synchronizing the download. Those of skill in the art will be well aware of this method of downloading software to be run by controller 32.

As indicated above, the debounce algorithm thus downloaded to the controller 32 might involve steps other than, for example, simply waiting a time T before allowing the change of state of the input signal to be transmitted as a control signal. For example, where the input signal is a analog value, such as a temperature reading (as opposed to a binary ON/OFF input signal from a level sensor, as above) the algorithm might effectively implement a spacing between the changes of state of the controlled device; as above, this is sometimes referred to as providing hysteresis, or providing conditioning of the control loop. More specifically, where a thermometer is the input device and a furnace the controlled device, such that the furnace is to be operated to keep the temperature constant, the algorithm can be implemented, for example, so as to activate the furnace when the measured temperature is one degree less than the desired value, and turn it off when the temperature is one degree greater than the setpoint value; this would avoid "hunting" around the setpoint.

Numerous additional debouncing algorithms and methods for providing hysteresis in control loops and similar control schemes are known to the art and are to be considered within the scope of the invention.

Stated broadly, then, the function of the modular debouncing device of the invention is to detect changes of state of the input signal and analyze the input signal according to a stored debouncing algorithm to determine whether it is appropriate to cause the controlled device to change its state, thus "debouncing" the input signal.

The functions of the other components of the modular debounce circuit of the invention, as shown by FIG. 3, include an input optoisolator 36 comprising a light emitting diode 38 and a phototransistor 40. As is well understood, the photodiode emits radiation responsive to the input signal, and the phototransistor 40 becomes conductive responsive thereto. Thus the output of the phototransistor, which is supplied to the controller 32 as shown, reproduces the input signal, but effectively buffers the controller 32 from any voltage spikes or the like in the input signal. A similar optoisolator 42 on the output side likewise buffers the controller 32 from any spikes on the side of the controlled element.

As illustrated, the phototransistors of both optoisolators 36 and 42 are of "PNP" type, referring to the direction in which current can flow therethrough; either or both could be replaced with NPN types, depending on the input and output components to be monitored and controlled respectively. It is also within the scope of the invention to provide both PNP and NPN optoisolators as part of the standard unit, with switches to select one or the other when the standard unit is customized for a particular application.

Also shown in the circuit of FIG. 3 is a light-emitting diode (LED) 44, which is illuminated responsive to an output signal from controller 32; this output signal turns the LED on or off as desired, by controlling a field-effect transistor (FET) 46 to conduct or not correspondingly. Typically LED 44 will be illuminated when the control signal to the output device is ON, will be dark when the control signal is OFF, and will blink when the output is in transition, i.e., during the debounce period. This visual output can be useful to an operator in verifying the operation of the device. FET 46 also provides an isolation function, i.e., buffers the controller 32 so as to allow programming of the controller while active.

Finally, zener diodes 48 and 50 are provided across the 24 VDC power input, the output signal line, and circuit common to prevent damage to the controller from power spikes on the load side. Diode 52 similarly prevents damage to the controller in the event of a reverse-polarity connection. The remaining capacitors and resistors shown are provided to smooth the 5 VDC circuit power, limit current to the LED's, and the like, all in a manner which will be fully apparent to those of skill in the art.

Thus, the principal attributes and functions of the modular debounce device of the invention are as follows: it is to be capable of being connected between typical input devices, such as switches or sensors and the corresponding controlled elements, preferably using standard connections without modification; it is preferably operable on the power present for the sensor or other input device; it detects changes of state of an input signal and analyzes them according to a stored algorithm in order to determine whether the change of state is to be acted upon; and, when appropriate, it provides a suitably debounced output control signal to the controlled element. Preferably, the device can be manufactured in standard form and the desired debouncing algorithm conveniently downloaded to the controller in order to customize the standard unit for a desired application.

The invention should not be limited to the above preferred embodiment, which is exemplary only. Those of skill in the art will readily recognize further improvements and modifications that could readily be added within the spirit and scope of the invention. Therefore, the invention is to be limited only by the claims which follow.

What is claimed is:

1. A modular debouncing device for being interposed between an input device and a controlled device, comprising:
   an input connection for receiving an input signal from the input device;
   an output connection for providing an output signal to the controlled device;
   a controller for receiving the input signal, detecting that a change of state of the input signal has occurred, analyzing the input signal according to a stored debouncing algorithm in order to determine whether it is appropriate to cause the controlled device to change state, and providing an output signal accordingly, wherein the input and output connections are made using mating industry-standard connectors, and wherein the sensor element and controlled element are provided with corresponding industry-standard connections, whereby the modular debouncing device can be interposed between an input device and a controlled device without modification of either.

2. The modular debouncing device of claim 1, wherein the modular debouncing device is manufactured in an unprogrammed state and is customized to the requirements of an end user by downloading and storing an appropriate debouncing alogorithm.

3. The modular debouncing device of claim 2, wherein the controller is capable of being connected to a programming header for allowing downloading of a desired debouncing algorithm.

4. The modular debouncing device of claim 1, wherein the stored debouncing algorithm effectuates a delay of time T between a change of state of the input signal and controlling the output signal to change its state.

5. The modular debouncing device of claim 4, wherein the delay time T is implemented upon change of state of the input signal from a first state to a second state, and is not applied upon change of state of the input signal from the second state to the first state.

6. The modular debouncing device of claim 4, wherein the delay time T can be adjusted by means of a potentiometer.

7. The modular debouncing device of claim 1, wherein the algorithm effectuates hysteresis in the output signal.

8. The modular debouncing device of claim 1, wherein the controller is connected to the input connection by way of an optoisolator.

9. The modular debouncing device of claim 8, wherein the optoisolator comprises a phototransistor of PNP type.

10. The modular debouncing device of claim 1, wherein the controller is connected to the output connection by way of an optoisolator.

11. The modular debouncing device of claim 10, wherein the optoisolator comprises a phototransistor of PNP type.

12. The modular debouncing device of claim 1, wherein the stored debouncing algorithm effectuates a delay of time T between a change of state of the input signal and controlling the output signal to change its state, and wherein the delay time T can be adjusted by an end user.

13. The modular debouncing device of claim 1, wherein the modular debouncing circuit operates using power supplied to the input device.

14. The modular debouncing device of claim 1, wherein the input device is a switch.

15. The modular debouncing device of claim 1, wherein the input device is a sensor.

16. The modular debouncing device of claim 15, wherein the input device is a photosensor.

* * * * *